United States Patent
Lee et al.

(10) Patent No.: US 7,584,304 B2
(45) Date of Patent: Sep. 1, 2009

(54) NON-VOLATILE MEMORY STORAGE DEVICE INCLUDING AN INTERFACE SELECT SWITCH AND ASSOCIATED METHOD

(75) Inventors: Jeong-Woo Lee, Seoul (KR); Dong-Ryul Ryu, Gyeonggi-do (KR)

(73) Assignee: Samsung Electronics, Suwon-si, Gyeonggi-do (KR)

( * ) Notice: Subject to any disclaimer, the term of this patent is extended or adjusted under 35 U.S.C. 154(b) by 336 days.

(21) Appl. No.: 11/181,212

(22) Filed: Jul. 13, 2005

(65) Prior Publication Data
US 2006/0069820 A1 Mar. 30, 2006

(30) Foreign Application Priority Data
Sep. 24, 2004 (KR) ............... 10-2004-0076914

(51) Int. Cl.
*G06F 3/00* (2006.01)
(52) U.S. Cl. .................................................. 710/2
(58) Field of Classification Search ................ 710/2
See application file for complete search history.

(56) References Cited

U.S. PATENT DOCUMENTS

| | | | |
|---|---|---|---|
| 6,735,650 B1 | 5/2004 | Rothberg | |
| 2002/0152339 A1* | 10/2002 | Yamamoto | 710/36 |
| 2003/0081378 A1 | 5/2003 | Debbins et al. | |
| 2003/0191874 A1* | 10/2003 | Drescher et al. | 710/38 |
| 2003/0221061 A1 | 11/2003 | El-Batal et al. | |
| 2004/0120353 A1* | 6/2004 | Kim et al. | 370/503 |
| 2004/0128422 A1* | 7/2004 | Zayas | 710/305 |
| 2004/0158669 A1* | 8/2004 | Weng et al. | 711/103 |
| 2005/0015545 A1* | 1/2005 | Liu et al. | 711/114 |
| 2005/0182510 A1* | 8/2005 | Bress et al. | 700/214 |
| 2005/0240713 A1* | 10/2005 | Wu et al. | 710/314 |
| 2005/0251588 A1* | 11/2005 | Hoch et al. | 710/5 |
| 2006/0112216 A1* | 5/2006 | Bashford et al. | 711/105 |

FOREIGN PATENT DOCUMENTS

| | | |
|---|---|---|
| KR | 2004-0021043 | 3/2004 |
| WO | WO 03/085535 | 10/2003 |

OTHER PUBLICATIONS

Flash Memory, 2003, Wiley Publishing, Inc. referenced by CREDO Reference, www.xreferplus.com.*
English language abstract of the Korean Publication No. 2004-0021043.

* cited by examiner

*Primary Examiner*—Henry W. H. Tsai
*Assistant Examiner*—Hyun Nam
(74) *Attorney, Agent, or Firm*—Marger Johnson & McCollom, P.C.

(57) ABSTRACT

We describe and claim an improved non-volatile memory storage device including an interface select switch and associated method. The device comprises a non-volatile memory, and an interface unit including a plurality of storage interfaces, the interface unit to select a storage interface from the plurality of storage interfaces responsive to a selection signal, where the non-volatile memory to exchange data with a host external to the device via the selected storage interface. In an embodiment, the selected storage interface is an ATA storage interface to convert the exchanged data in accordance with an ATA protocol when selected responsive to the selection signal. In another embodiment, the selected storage interface is a SATA storage interface to convert the exchanged data in accordance with a SATA protocol when selected responsive to the selection signal.

16 Claims, 2 Drawing Sheets

NON-VOLATILE MEMORY STORAGE DEVICE INCLUDING AN INTERFACE SELECT SWITCH AND ASSOCIATED METHOD

BACKGROUND OF THE INVENTION

This application claims priority from Korean patent application No. 10-2004-0076914, filed on Sep. 24, 2004, which we incorporate by reference.

1. Field of the Invention

The field of the invention relates to a non-volatile memory storage device and, more particularly, to a non-volatile memory storage device including a switch to select between one or more interfaces.

2. Description of the Related Art

A non-volatile memory storage device is a small device that can store a large amount of data without requiring a continuous power supply. Thus, the non-volatile memory storage device is frequently used as a portable storage device.

Conventional non-volatile memory storage devices typically support only one interface, either the Advanced Technology Attachment (ATA) specification or the Serial Advanced Technology Attachment (SATA) specification. Accordingly, there is a need for a non-volatile semiconductor memory storage device that can support both the SATA and ATA interfaces.

SUMMARY OF THE INVENTION

The present invention provides a non-volatile semiconductor memory storage device capable of supporting a plurality of storage interfaces. The device comprises a non-volatile memory and an interface unit including a plurality of storage interfaces. The interface unit is adapted to select a storage interface from the plurality of storage interfaces responsive to a selection signal. The non-volatile memory is adapted to exchange data with a host external to the device via the selected storage interface. In an embodiment, the selected storage interface is an ATA storage interface to convert the exchanged data in accordance with an ATA protocol when selected responsive to the selection signal. In another embodiment, the selected storage interface is a SATA storage interface to convert the exchanged data in accordance with a SATA protocol when selected responsive to the selection signal.

BRIEF DESCRIPTION OF THE DRAWINGS

The aspects and advantages of the present invention will become more apparent with the detailed description of the exemplary embodiments with reference to the attached drawings.

DETAILED DESCRIPTION OF THE INVENTION

Figure 1:
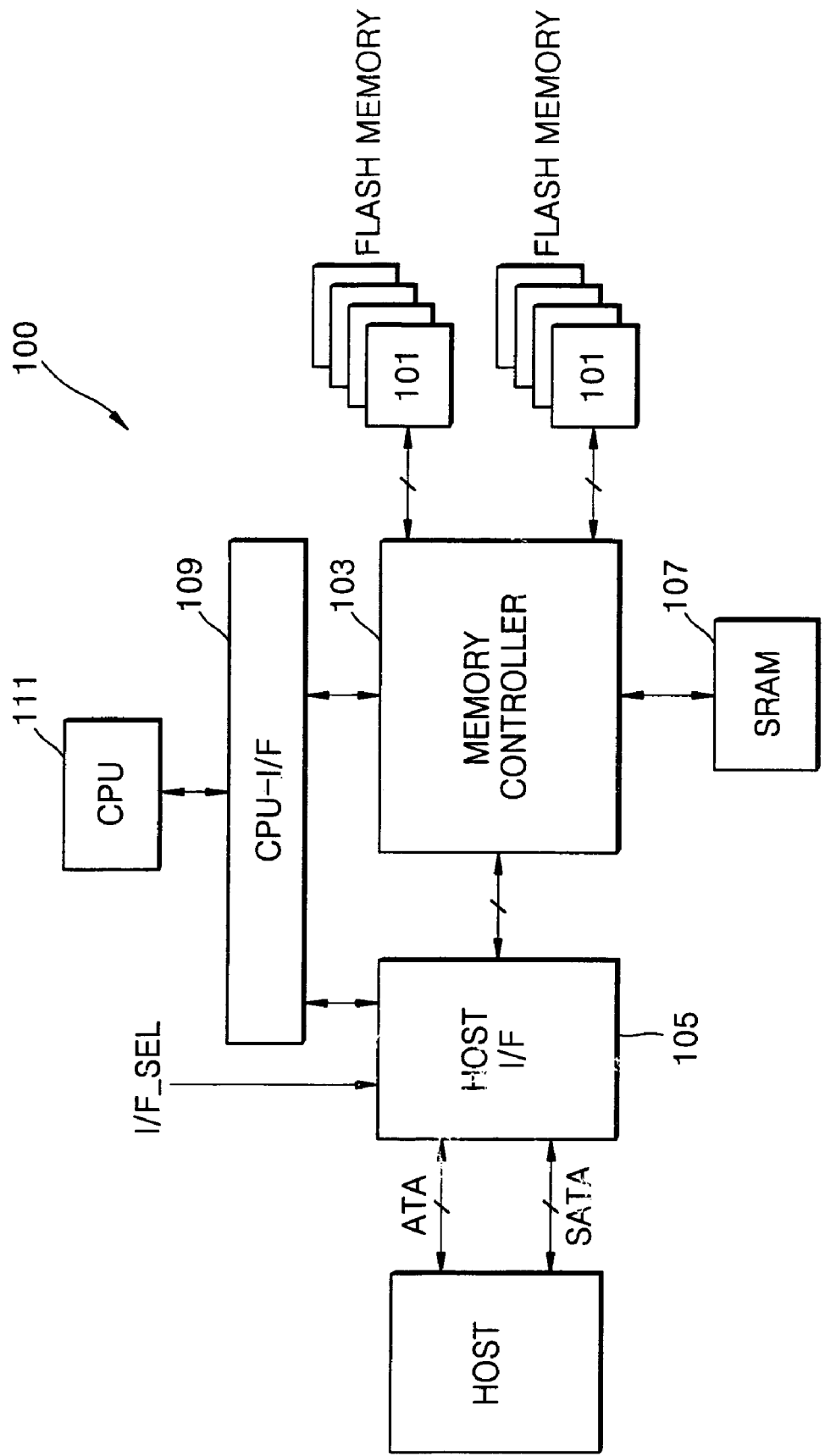
FIG. 1 is a block diagram of a non-volatile memory storage device according to an embodiment of the present invention.

Embodiments of the present invention will now be described in detail with reference the accompanying drawings. Like reference numerals are used to designate like or equivalent elements throughout this description.

FIG. 1 is a block diagram of a non-volatile memory storage device 100 according to an embodiment of the present invention. The non-volatile memory storage device 100 includes a non-volatile memory 101, a memory controller 103, an interface unit 105, a memory buffer 107, a central processing unit (CPU) interface unit 109, and a CPU 111.

The non-volatile memory 101 stores data from an external host. As shown in FIG. 1, the non-volatile memory 101 may comprise a plurality of non-volatile memory chips. The non-volatile memory 101 may be flash memory.

The memory controller 103 controls access to the non-volatile memory 101. The memory controller 103 may detect and correct errors in the data stored to or retrieved from the non-volatile memory 101. Although not shown in the drawings, the memory controller 103 may include a scrambler to map an input digital signal stream to a signal stream with different statistical characteristics, and an arbiter to allow access to non-volatile memory 101 according to priority.

The interface unit 105 selects either an ATA interface or an SATA interface in response to an external ATA/SATA selection signal I/F_SEL, and allows the exchange of data between the external host and the non-volatile memory storage device 100 via the selected ATA or SATA interface. The interface unit 105 may allow the exchange of data or signals between the external host and the CPU 111. The ATA/SATA selection signal I/F_SEL may be generated using an external selection switch (not shown). The external selection switch may be a jumper switch. In other words, the interface unit 105 may select either the ATA interface or the SATA interface using the external selection switch. When the ATA interface is selected, the interface unit 105 converts data exchanged between the external host and the non-volatile memory 101 according to the ATA specification. When the SATA interface is selected, the interface unit 105 converts data exchanged between the external host and the non-volatile memory 101 according to the SATA specification. Since the SATA interface is backward compatible with respect to the ATA interface, e.g., implementing E-IDE (Extended-Integrated Drive Electronics), the ATA interface may be executed using the SATA interface.

The memory buffer 107 temporarily stores data retrieved from or to be stored to non-volatile memory 101. The memory buffer 107 may store a program(s) to be executed by the CPU 111. The memory buffer 107 may be a static random access memory (SRAM). The CPU interface unit 109 couples the interface unit 105, the memory controller 103, with the CPU 111, so the CPU 111 may provide signals to the interface unit 105 and the memory controller 103. The CPU 111 may control the overall operation of the non-volatile memory storage device 100 by executing the program stored in the memory buffer 107.

Accordingly, non-volatile memory storage device 100 supports both the ATA interface and the SATA interface without installing different software.

Figure 2:
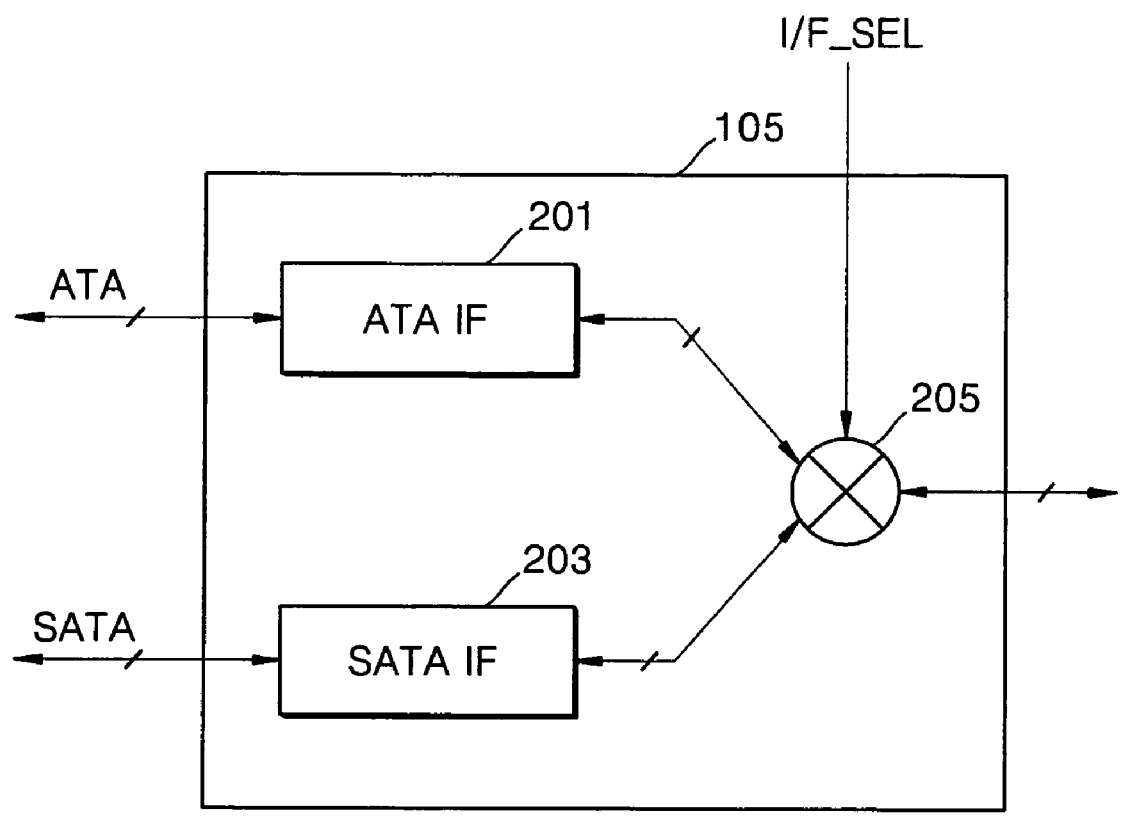
FIG. 2 is a block diagram of the interface unit in FIG. 1.

FIG. 2 is a detailed block diagram of the interface unit 105. Referring to FIG. 2, the interface unit 105 includes an ATA interface logic unit 201, a SATA interface logic unit 203, and a multiplexer 205. The ATA interface logic unit 201 supports the ATA interface. Specifically, the ATA interface logic unit 201 converts data from the non-volatile memory 101, or signals from the other elements of the non-volatile memory storage device 100, into data that satisfies the ATA protocol, and provides the converted data to an external host. The ATA interface logic unit 201 receives data from an external host, converts the data in accordance to the ATA specification, and provides the converted data to the non-volatile memory 101 or the other elements within device 100.

The SATA interface logic unit 203 supports the SATA interface. Specifically, the SATA interface logic unit 203 converts data from the non-volatile memory 101, or signals from the other elements of device 100, into data that satisfies the SATA protocol, and provides the converted data to an external host. The SATA interface logic unit 203 receives data from an external host, converts the data in accordance to the SATA specification, and provides the converted data to the non-volatile memory 101 or the other elements within device 100.

In response to the ATA/SATA selection signal I/F_SEL, the multiplexer 205 provides data from the non-volatile memory 101 to either the ATA interface logic unit 201 or the SATA interface logic unit 203. The multiplexer 205 provides data from either the ATA interface logic unit 201 or the SATA interface logic unit 203 to the non-volatile memory 101, via the memory controller 103.

As described above, a non-volatile memory storage device 100 according to an embodiment of the present invention is capable of supporting both the SATA and the ATA specifications without an additional interface. Therefore, the non-volatile memory storage device 100 implements both interfaces with the same software.

While this invention has been particularly shown and described with reference to exemplary embodiments thereof, it will be understood by those skilled in the art that various changes in form and details may be made therein without departing from the spirit and scope of the invention as defined by the appended claims.

We claim:

1. A device comprising:
a non-volatile semiconductor memory; and
an interface unit including a plurality of storage interfaces, the plurality of storage interfaces including:
an Advanced Technology Attachment (ATA) storage interface directly coupled to an external host to convert data in accordance with an ATA protocol when selected responsive to a selection signal; and
a Serial Advanced Technology Attachment (SATA) storage interface directly coupled to the external host to convert the data in accordance with a SATA protocol when selected responsive to the selection signal; and
a memory controller to scramble the converted data and to map an input digital signal stream to a signal stream with different statistical characteristic;
where the interface unit is structured to select a storage interface from the plurality of storage interfaces responsive to the selection signal;
where the host is external to the device, and the non-volatile semiconductor memory is structured to exchange the data with the external host via the selected storage interface; and
where the non-volatile semiconductor memory includes one or more non-volatile memory chips, and any selected one of the ATA storage interface and SATA storage interface is commonly connected to the one or more non-volatile memory chips.

2. The device of claim 1 where the interface unit comprises a multiplexer to select the storage interface responsive to the selection signal.

3. The device of claim 2 where the non-volatile memory exchanges data with the host via the selected storage interface and the multiplexer.

4. The device of claim 1 where the non-volatile memory comprises a plurality of non-volatile memory chips.

5. The storage device of claim 1 where the non-volatile memory is flash memory.

6. The device of claim 1 comprising
the memory controller to control access to the non-volatile memory; and
where the non-volatile memory is structured to exchange data with the host via the selected storage interface and the memory controller.

7. The device of claim 6, where the data comprises first data, and where the memory controller is structured to:
detect errors in second data transmitted from the non-volatile memory to the host;
correct the detected errors in the second data;
detect errors in third data transmitted from the host to the non-volatile memory; and
correct the detected errors in the third data.

8. The device of claim 7 further comprising a central processing unit to exchange fourth data with the host via the selected storage interface.

9. The storage device of claim 1 comprising a switch unit to generate the selection signal.

10. The storage device of claim 9 where the switch unit is a jumper switch located externally to the device.

11. A device comprising
an Advanced Technology Attachment (ATA) storage interface to convert data in accordance with an ATA protocol;
a Serial Advanced Technology Attachment (SATA) storage interface to convert data in accordance with a SATA protocol;
a multiplexer to select one of the storage interfaces responsive to a selection signal; and
a memory controller to prioritize access to non-volatile semiconductor memory, to scramble the converted data, and to mare an input digital signal stream to a signal stream with different statistical characteristics,
where the selected storage interface is structured to convert data exchanged between the non-volatile semiconductor memory and a host external to the device; and
where the non-volatile semiconductor memory includes one or more non-volatile memory chips, and any selected one of the ATA storage interface and SATA storage interface is commonly connected to the one or more non-volatile memory chips.

12. The device of claim 11 where the non-volatile memory is flash memory.

13. A method for providing access to a plurality of non-volatile semiconductor memory devices via multiple interfaces, comprising:
receiving a selection signal;
selecting one of an Advanced Technology Attachment (ATA) storage interface and a Serial Advanced Technology Attachment (SATA) storage interface responsive to the selection signal;
transmitting first data from a plurality of non-volatile semiconductor memory chips to a host responsive to the selecting;
transmitting second data from the host to the plurality of non-volatile semiconductor memory chips responsive to the selecting;
scrambling the second data within a memory controller;
mapping an input digital signal stream to a signal stream with different statistical characteristics; and
detecting and correcting errors in both the first data and the second data within the memory controller,
where any selected one of the ATA storage interface and SATA storage interface is commonly connected to each of the plurality of non-volatile memory chips.

14. The method of claim 13 further comprising:
temporarily storing the first data transmitted from the plurality of non-volatile semiconductor memory chips to the host in a Static Random Access Memory (SRAM) memory buffer;

temporarily storing the second data transmitted from the host to the plurality of non-volatile semiconductor memory chips in the SRAM memory buffer;

storing program instructions in the SRAM memory buffer, a central processing unit executing the stored program instructions to control the temporarily stored first and second data; and selecting the storage interface to exchange third data between the central processing unit and the host responsive to the selection signal.

15. The method of claim 13, further comprising accessing the plurality of non-volatile semiconductor memory chips according to priority determined by a memory controller.

16. The device of claim 1 where the device further comprises:

a memory controller to prioritize access to the non-volatile semiconductor memory.

* * * * *

UNITED STATES PATENT AND TRADEMARK OFFICE
CERTIFICATE OF CORRECTION

PATENT NO.        : 7,584,304 B2
APPLICATION NO.   : 11/181212
DATED             : September 1, 2009
INVENTOR(S)       : Jeong-Woo Lee et al.

It is certified that error appears in the above-identified patent and that said Letters Patent is hereby corrected as shown below:

Column 3, line 41, the word "characteristic" should read -- characteristics --;
Column 4, line 27, the word "access to" should read -- access to a --;
Column 4, line 29, the word "mare" should read -- map --;
Column 4, lines 41-42, the word "nonvolatile" should read -- non-volatile --.

Signed and Sealed this

First Day of December, 2009

David J. Kappos
*Director of the United States Patent and Trademark Office*